United States Patent
Bisanti et al.

(10) Patent No.: US 7,136,626 B2
(45) Date of Patent: Nov. 14, 2006

(54) RADIO FREQUENCY MODULATOR

(75) Inventors: Biagio Bisanti, Antibes (FR); Stefano Cipriani, Vallauris (FR); Eric Duvivier, Golfe Juan (FR)

(73) Assignee: Texas Instruments Incorporated, Dallas, TX (US)

( * ) Notice: Subject to any disclaimer, the term of this patent is extended or adjusted under 35 U.S.C. 154(b) by 509 days.

(21) Appl. No.: 10/071,919

(22) Filed: Feb. 8, 2002

(65) Prior Publication Data

US 2003/0153286 A1     Aug. 14, 2003

(30) Foreign Application Priority Data

Apr. 9, 2001    (EP)    .................... 01400914

(51) Int. Cl.
  *H04B 1/02*    (2006.01)
  *H04B 1/04*    (2006.01)
(52) U.S. Cl. .................. 455/91; 455/110; 455/126; 375/308
(58) Field of Classification Search ........ 455/110–113, 455/114.2, 118–119, 126, 76, 108, 115.1; 332/123, 124, 125, 126, 127, 128; 375/298, 375/382, 300, 306–307, 375, 376, 302, 308
See application file for complete search history.

(56) References Cited

U.S. PATENT DOCUMENTS

| 4,282,497 | A | * | 8/1981 | Hulbert | 332/124 |
| 4,554,517 | A | * | 11/1985 | Parniere et al. | 332/124 |
| 4,755,774 | A | * | 7/1988 | Heck | 332/123 |
| 5,834,985 | A | * | 11/1998 | Sundeg.ang.rd | 332/100 |
| 5,834,987 | A | * | 11/1998 | Dent | 332/127 |
| 5,894,496 | A | * | 4/1999 | Jones | 455/126 |
| 5,903,611 | A | * | 5/1999 | Schnabl et al. | 375/297 |
| 5,920,808 | A | * | 7/1999 | Jones et al. | 455/127.1 |
| 5,952,895 | A | * | 9/1999 | McCune et al. | 332/128 |
| 6,046,646 | A | * | 4/2000 | Lo et al. | 331/10 |
| 6,298,093 | B1 | * | 10/2001 | Genrich | 375/271 |
| 6,384,677 | B1 | * | 5/2002 | Yamamoto | 330/10 |
| 6,449,466 | B1 | * | 9/2002 | Jin et al. | 455/127.2 |

(Continued)

FOREIGN PATENT DOCUMENTS

WO    WO 99/43080 A1    8/1999

(Continued)

OTHER PUBLICATIONS

Perrott, Michael H., et al., "A 27-mW CMOS Fractional-N Synthesizer Using Digital Compensation for 2.5-Mb/s GFSK Modulation," *IEEE Journal of Solid-State Circuits*. vol. 32, No. 12, Dec. 1997, pp. 2048-2060.

(Continued)

*Primary Examiner*—Simon Nguyen
(74) *Attorney, Agent, or Firm*—Ronald O. Neerings; W. James Brady, III; Frederick J. Telecky, Jr.

(57) ABSTRACT

A transmitter architecture (200) provides for a stable and low noise modulator where the modulation bandwidth is uncorrelated to the TX loop bandwidth. The output signal (228) of the TX loop is demodulated by a demodulator (208) and the demodulated signal is compared by a comparator (206) with the modulating input signal (202). The output of the comparator is then used to adjust a digital pre-emphasis filter (204) which preconditions the modulating input signal (202) in the digital domain. The preconditioning approach of the present invention provides for low noise because the transmitter designer can chose a narrow band for the TX loop which will also filter out the noise coming from the additional synthesizer (226) used to down convert the input signal.

20 Claims, 1 Drawing Sheet

U.S. PATENT DOCUMENTS 6,678,503 B1 * 1/2004 Black et al. .................. 455/76
6,731,713 B1 * 5/2004 Beard ......................... 375/376
6,734,749 B1 * 5/2004 Mattisson et al. .......... 332/127

FOREIGN PATENT DOCUMENTS

WO      WO 01/11766 A1    2/2001

OTHER PUBLICATIONS

Kajiwara, Akihiro, et al., "A New PLL-FM Modulator with Rapid Acquisition Time," 1990 IEEE International Symposium on Circuits and Systems, vol. 4, May 1990, pp. 2917-2920.

* cited by examiner

RADIO FREQUENCY MODULATOR

TECHNICAL FIELD

This invention relates in general to the field of radio communications, and more specifically to a radio frequency modulator architecture suitable for any kind of phase or frequency modulation.

BACKGROUND

A traditional radio frequency (RF) transmitter (TX) architecture is shown in FIG. 1 which can be used to transmit a frequency or phase modulated signal. When designing an RF transmitter, the transmitter designer needs to deal with a troubling trade-off between the modulation bandwidth (BW) and the TX loop BW. To avoid any distortion in the modulated signal, the TX loop BW has to be designed to be much larger than the modulation BW. This requires a transmitter architecture having a large comparison frequency for the TX loop in order to minimize the spurious problem linked to the large bandwidth of the TX loop, as well as the critical noise response of the TX loop for the wide band noise (inside the TX loop BW itself).

In U.S. Pat. No. 5,953,895 a solution to the above noted problem is provided since in the approach described, the TX loop bandwidth and the modulation bandwidth are not related. The above noted patent attempts to solve the problem of distortion caused by the transmission PLL on the modulation spectrum with a method referred to as two-point modulation. The approach described however suffers from a major drawback presented by the critical noise response caused by the additional modulation added after the loop filter (item 403 in FIG. 1). In fact, the adding of an extra signal (in this case just part of the modulation) just in front of the VCO and after the loop filter, adds extra noise that is not be filtered out by the TX loop.

The TX loop in a transmitter acts as a frequency translator and as a low pass filter for the modulating signal. To avoid any signal corruption it is important to keep the TX loop BW larger than the modulation BW. In addition, to be compliant with present day modulation standards, a very low noise PLL is required, making quite difficult its design and integration. A need thus exist for a modulation scheme that allows for narrowing of the TX loop BW to relax the spec of the TX loop as well as to allow for easier integration. Such a modulation scheme should provide for a stable and low noise modulator where the modulation bandwidth is uncorrelated to the TX loop bandwidth.

BRIEF DESCRIPTION OF THE DRAWINGS

The features of the present invention, which are believed to be novel, are set forth with particularity in the appended claims. The invention, may best be understood by reference to the following description, taken in conjunction with the accompanying drawings, in the several figures of which like reference numerals identify like elements, and in which:

DETAILED DESCRIPTION OF THE PREFERRED EMBODIMENT

Figure 1:
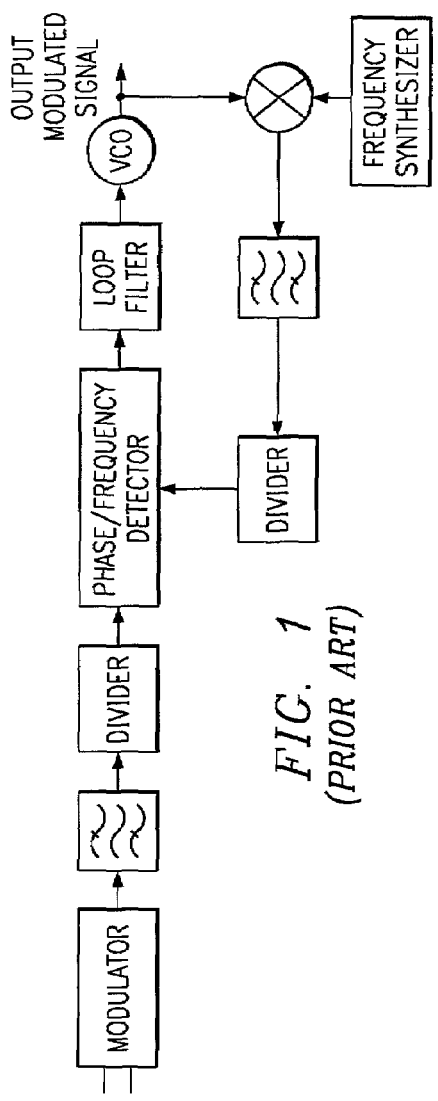
FIG. 1 shows a block diagram of prior art transmitter.

While the specification concludes with claims defining the features of the invention that are regarded as novel, it is believed that the invention will be better understood from a consideration of the following description in conjunction with the drawing figures, in which like reference numerals are carried forward.

Figure 2:
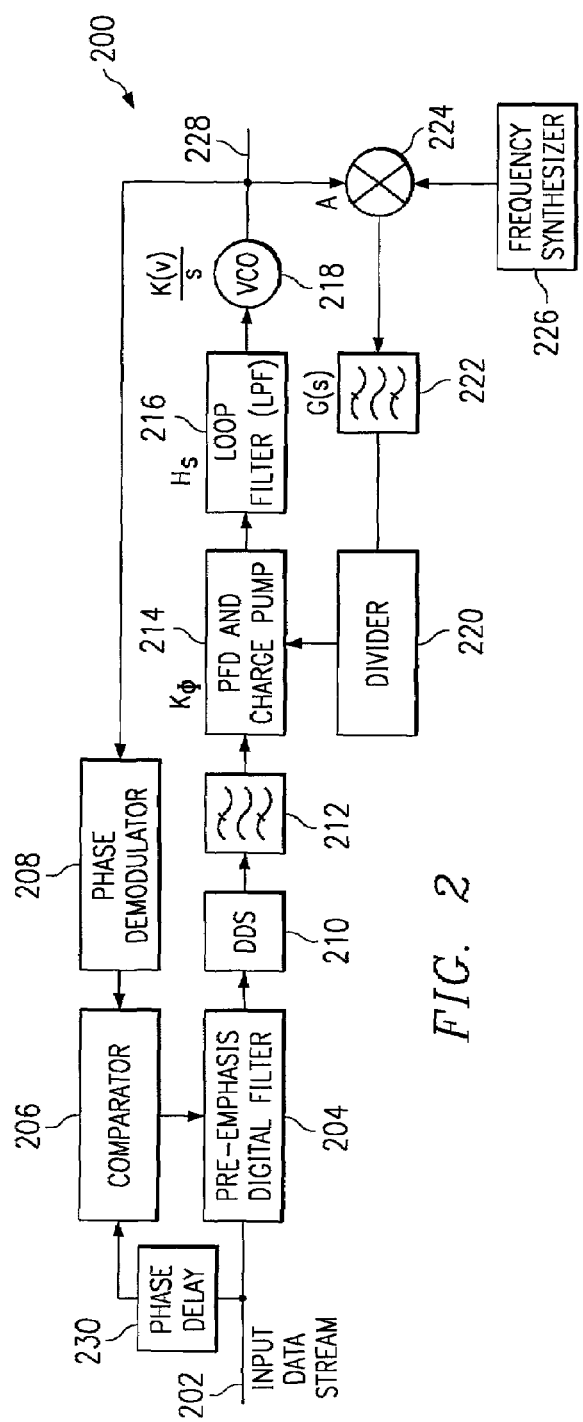
FIG. 2 shows a block diagram of a transmitter in accordance with the invention.

A modulator architecture 200 is shown in FIG. 2 which provides for a stable and low noise modulator where the modulation bandwidth is uncorrelated to the TX loop bandwidth. In accordance with the invention, the output signal 228 coming out of the TX loop is demodulated by demodulator 208 and compared using comparator 206 with the modulating input signal 202. The output of the comparator 206 is then used to adjust a digital pre-emphasis filter 204. The digital pre-emphasis filter 204 avoids distortion of the modulating signal by providing a filter that has the inverse of the TX loop transfer function. The PLL (Tx loop) further includes a conventional phase/frequency detector and charge pump block 214, a low pass loop filter 216, oscillator 218 which in this embodiment is a voltage controlled oscillator (VCO), a filter 222 and divider 220.

The transfer function of the Tx loop of FIG. 2 is equal to:

$$T(s) = \frac{\frac{k\Phi \cdot H_{(s)} \cdot K_v}{s}}{1 + \frac{K\Phi \cdot H_{(s)} \cdot K_v}{N \cdot s}}$$

In the above transfer function, the transfer function of the filter 222 and of the mixer 224 are not included because these have no distortion effect. So in accordance with the invention, the transfer function of the pre-emphasis filter 204 should be set equal to:

$$F(s) = \frac{1}{T(s)}.$$

The approach provided by RF modulator 200 is inherently low noise since a narrow band can be selected for the TX loop which will also filter out the noise coming from the additional synthesizer 226 used to down convert the output signal 228. By using a digital pre-emphasis filter 204 as described above which has a filter characteristic substantially equal to the inverse of the transfer function of the PLL loop, the preconditioning of the signal 202 can be done in an easy and controllable fashion. In addition, by using a digital pre-emphasis filter 204, analog components are minimized allowing for easier integration of the modulator 200. The parameters that determine the TX loop transfer function can change over process and temperature; therefore, trimming of the pre-emphasis filter transfer function can be done in order to maintain the control over the accuracy of the modulation. Since in the preferred embodiment the pre-emphasis filter 204 is a digital filter it can be actively tuned by for example, a control circuit such as a controller (e.g., microprocessor or digital signal processor) to account for changes in the TX loop transfer function. The modulator 200 shown in FIG. 2 further includes a conventional direct digital synthesizer (DDS) 210 having an input port for receiving the output of the pre-emphasis filter 204 and a filter 212 for filtering the output of the DDS 210 prior to presentation of the signal to the phase/frequency detector and charge pump block 214.

The present invention provides for a modulator and method for controlling the accuracy of the modulation by preconditioning the modulating signal in the digital domain using a controlled digital pre-emphasis filter. The modulator is stable and provides for low noise, and the modulation bandwidth is not correlated to the TX loop bandwidth.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims. For example, although the present invention has been described in association with the architecture shown in FIG. 2, the invention is applicable to other schemes that need the same kind of control on the modulating signal.

The invention claimed is:

1. A radio frequency modulator, comprising:
   a phase lock loop (PLL) having an input port for receiving a modulation signal and producing as an output signal a modulated RF signal at an output port;
   a phase demodulator having an input port for receiving the modulated RF signal and having an output port for providing a phase information signal;
   a comparator having a first input port for receiving the phase information signal and a second input port for receiving the modulation signal and an output port for providing an error signal; and
   a pre-emphasis filter in response to receiving the error signal adjusts the modulation signal provided to the PLL.

2. A radio frequency modulator as defined in claim 1, wherein the pre-emphasis filter comprises a digital pre-emphasis filter.

3. A radio frequency modulator as defined in claim 1, further comprising a direct digital synthesizer (DDS) coupled between the pre-emphasis filter and the PLL.

4. A radio frequency modulator as defined in claim 1, wherein the PLL has a transfer function and the pre-emphasis filter preconditions the modulation signal with a filter response which is about the inverse of the PLL transfer function.

5. A radio frequency modulator as defined in claim 1, wherein the phase demodulator comprises a digital phase demodulator.

6. A radio frequency modulator as defined in claim 1, wherein the modulation signal comprises a digital modulation signal.

7. A radio frequency modulator as defined in claim 1, wherein the modulation signal is subject to a phase delay prior to being input to the second input port of the comparator.

8. A radio frequency modulator as defined in claim 1, wherein the phase lock loop (PLL) comprises a loop filter coupling a phase/frequency detector and charge pump to an oscillator.

9. A radio frequency modulator as defined in claim 8, wherein the loop filter is a low pass filter.

10. A radio frequency modulator as defined in claim 8, wherein the oscillator is a voltage controlled oscillator (VCO).

11. A method of producing a stable and low noise modulator, comprising the steps of:
    (a) providing a phase lock loop (PLL) for receiving a modulation signal and producing a modulated RF signal;
    (b) demodulating the modulated RF signal to produce a demodulated signal;
    (c) comparing the demodulated signal with the modulation signal in order to provide an error signal; and
    (d) using the error signal to precondition the modulation signal provided to the PLL using a pre-emphasis filter.

12. A method as defined in claim 11, wherein step (d) comprises preconditioning the modulation signal in the digital domain using a digital pre-emphasis filter.

13. A method as define in claim 11, wherein the PLL has a transfer function and the pre-emphasis filter has a filter response of about the inverse of the PLL transfer function.

14. A digital modulator for use in a radio frequency transmitter, comprising:
    a phase-lock-loop (PLL) loop producing as an output signal a modulated RF signal, wherein the phase lock loop (PLL) comprises a loop filter coupling a phase/frequency detector to an oscillator;
    a phase demodulator having an input port for receiving unmodified the modulated RF signal and having an output port for providing a phase information signal; and
    a comparator having a first input port for receiving the phase information signal and having an output port for outputting an error signal.

15. A radio frequency (RF) modulator comprising:
    a phase-lock-loop (PLL) Jeep including a loop filter and receiving as an input signal a modulation signal and producing as an output signal a modulated RF signal;
    first circuitry for receiving unmodified the modulated RF signal and outputting an error signal; and
    second circuitry responsive to said error signal for controlling the amplitude of the modulation signal.

16. The radio frequency (RF) modulator of claim 15, wherein said circuitry for receiving unmodified the modulated RF signal and outputting an error signal comprises a phase demodulator coupled to receive the modulated RF signal.

17. The radio frequency (RF) modulator of claim 16, wherein said circuitry for receiving unmodified the modulated RF signal and outputting an error signal further comprises a comparison circuit coupled to the phase demodulator.

18. A method of producing phase shifts in a modulated RF signal, comprising the steps of:
    producing a modulated RF signal;
    receiving unmodified the modulated RF signal and outputting an error signal; and
    controlling the amplitude of a modulation signal in response to the error signal.

19. The method of claim 18, further comprising preconditioning the modulation signal in the digital domain prior to injection into a phase lock loop.

20. The method of claim 19, wherein a pre-emphasis filter is used in preconditioning the modulation signal.

* * * * *